(12) United States Patent
Wosik et al.

(10) Patent No.: US 12,369,500 B2
(45) Date of Patent: Jul. 22, 2025

(54) METHOD FOR PRODUCTION QUALITY CONTROL OF FLEXIBLE SUPERCONDUCTING TAPES

(71) Applicant: University of Houston System, Houston, TX (US)

(72) Inventors: Jaroslaw Wosik, Houston, TX (US); Jerzy Krupka, Izabelin (PL); Venkat Selvamanickam, Houston, TX (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 3583 days.

(21) Appl. No.: 14/328,120

(22) Filed: Jul. 10, 2014

(65) Prior Publication Data

US 2023/0232723 A1 Jul. 20, 2023

Related U.S. Application Data

(60) Provisional application No. 61/845,020, filed on Jul. 11, 2013.

(51) Int. Cl.
H01L 39/24 (2006.01)
H10N 60/01 (2023.01)

(52) U.S. Cl.
CPC .................................. *H10N 60/01* (2023.02)

(58) Field of Classification Search
None
See application file for complete search history.

*Primary Examiner* — C Melissa Koslow
(74) *Attorney, Agent, or Firm* — Jackson Walker LLP

(57) ABSTRACT

A method and apparatus for quality control of superconducting tapes, comprising non-destructive and non-contact methods for measuring the surface resistance of a superconducting tape during tape growth. The dielectric resonator techniques of the present invention can be adapted for measurements at the elevated temperatures used during annealing as well as at room and lower temperatures, providing the opportunity for real-time quality control of semiconductor tapes as they are being fabricated.

10 Claims, 14 Drawing Sheets a)

b)

a)

b)

a)

b)

METHOD FOR PRODUCTION QUALITY CONTROL OF FLEXIBLE SUPERCONDUCTING TAPES

This application claims priority to U.S. Provisional Patent Application Ser. No. 61/845,020, filed Jul. 11, 2013, entitled "Method for Production Quality Control of Flexible Superconducting Tapes," the entire content of which is hereby incorporated by reference.

BACKGROUND

The present disclosure relates to quality control methods for superconducting tapes, and more specifically to non-destructive and non-contact methods for measuring the surface resistance of a superconducting tape during tape growth.

Recent progress in the manufacturing of second-generation (2G) high temperature superconductor (HTS) deposited on buffered flexible metal substrates open more possibilities for electric power grid and superconducting magnet applications. In the current manufacturing process, HTS tapes such as $YBa_2Cu_3O_{7-x}$, on Hastelloy substrate (YBCO/Hastelloy) often have in situ quality control of surface morphology using high-speed cameras that can detect and flag defects and X-ray diffractometers to access and regulate the tape texture. However, these tools do, not provide direct information on the expected critical current performance of the superconductor tape. Since, kilometers long 2G tapes are manufactured by the MOCVD (or other) process, an ideal solution would encompass a non-contact and non-destructive technique capable of providing real time information about both the buffer and superconducting layers at each point of the manufacturing process. Such non-contact evaluation technique that can correlate normal state properties of the HTS tape during the MOCVD process to its superconducting properties has been elusive thus far.

SUMMARY

The present disclosure relates to quality control methods for superconducting tapes, and more specifically to non-destructive and non-contact methods for measuring the surface resistance of a superconducting tape during tape growth, which can be correlated with the complex conductivity and superconducting properties of the tape.

The present disclosure demonstrates that DR methods can be modified and tailored specifically for characterization of a normal/superconducting state conductivity of superconducting tapes. One of an array of DR resonators can be used. The method is both a non-destructive and non-contact technique. In general, such resonators can be used to measure, in situ, the surface resistance (in general complex conductivity) vs. temperature of the fabricated tapes and to provide, quality control during YBCO tape growth. It will allow detection of information about, potential superconducting properties of tapes deposited at room or higher temperature. YBCO tapes for energy application (dc current application) are deposited on metallic substrate, which makes characterization in normal state much different than characterization of YBCO thin films deposited on epitaxially polished dielectric substrate. However, the method of the present disclosure will also work when tapes are deposited on other than metallic alloy substrates, for example, dielectric substrates. The method also will work not only for high critical temperature superconductors (HTS), but also for other kinds, such as, for example, low critical temperature superconductors (LTS). This assumes that the slope of $R_s(T)$ in normal state of the LTS is correlated with superconducting parameters. It can work even for quality control of metals. In normal state, what is called "a superconductor" behaves like and is essentially just a normal metal.

Microwave material characterization techniques can be used in a variety of techniques, ranging from large scale remote sensing to detection of tumors or cardiovascular plaques in the human body. Microwave resonators can be used to measure the complex impedance of sample material. Microwave resonator techniques can be non-destructive, and in specific configurations, contact between the apparatus and the material to be characterized is not required. The present method can also measure surface impedance of a material in a very wide range, of several orders of magnitude.

Microwave material characterization techniques have been used in a large number of applications and are classified as a nondestructive evaluation (NDE) methods. One such method, a microwave dielectric resonator (DR) technique, has been successfully used for characterization of HTS in a superconducting state. For such an application, the DR is designed for maximum measurement sensitivity and large dynamic range of measured parameters and consists of an extremely low loss dielectric disk terminated with two endplates made of the HTS sample. The geometry and type of dielectric of a DR can be selected to according to the requirements of different applications.

In general, a material parameter of the complex conductivity is not directly measured, but instead the complex surface impedance $Z_s=R_s+iX_s$ is probed. The imaginary term represents the surface inductive reactance and the real part $R_s$ gives the surface losses per unit area. For the multilayered structures investigated herein, such defined impedance is a function of all parameters describing properties of the multilayers, which in the most general cases include superconductor/dielectric buffer/substrate/metal enclosure conductor. The formula:

$$Z_s = \sqrt{\frac{j\omega\mu_0}{\sigma(\omega, T)}}$$

for wave impedance derived for a bulk good conductor can be adopted for thick (larger than penetration depth) superconductors in local limit, which in turn makes $Z_s$ directly related to the complex conductivity $\sigma(\omega)=\sigma_1(\omega)-i\sigma_2(\omega)$, where the real $\sigma_1$ and imaginary $\sigma_2$ described as a function of frequency $\omega$ are related to the thermally excited quasi-particles (normal electrons) and the electronic excitation spectrum (superfluid density), respectively.

In literature, a typical approach for ascertaining the complex impedance of superconductors from measured frequency shift and Q-factor is to use perturbation theory. It has been shown that extended perturbation theory with the addition of impedance transformation, allows for determining the wave impedance of a superconductor with typical thickness of few hundred of nanometers with accuracy similar to the rigorous electromagnetic fields calculation approach. However, it has been shown that significant differences appear between the rigorous and perturbation methods for thin superconducting films (below 50 nm) at temperatures T that are close or above the critical temperature $T_c$ of the superconductor. In the latter temperature range, the film thickness (typically a few hundred nanometers) becomes comparable to or smaller than the penetration (or at the normal state the skin depth). In such a case, electromagnetic fields penetrate through the film and the sample cannot be treated as a bulk case as it is in the superconducting state. As a consequence, the surface impedance of the sample is no longer defined just in terms of the intrinsic (bulk) properties of the superconductor, because it also depends on other parameters, including its thickness, substrate permittivity (for dielectrics), and measurement technique related parasitic losses.

Therefore, for thin film normal state superconductor measurements, a different configuration of DR must be used than for the superconducting state, in order to discern YBCO/Hastelloy material properties. The conductivity of Hastelloy has been found to be comparable with the normal state conductivity of YBCO and in such a case the multilayered HTS tape structure with a metallic substrate and buffer layers poses a complicated electromagnetic problem and should be approached by a rigorous electromagnetic calculations method.

There have been several studies aimed at analyzing the correlation between normal/superconducting state and dc/high frequency properties of superconductor tapes. The correlation between grain sizes and normal and superconducting states was investigated, also information on the percolation, doping, and the presence of the defects obtained from the dc properties measured in the normal state was used to interpret the superconducting state parameters. There are also a few reports on existing correlations between normal state resistivity and critical current $J_c$ as well as about correlation between rf and dc $J_c$ and their dc magnetic field dependences. It has been shown that normal state surface resistance slope on temperature can be correlated with HTS tape superconducting properties.

Superconducting tapes are produced for use in superconducting magnets or in electric motors. Therefore, these tapes must sustain superconductivity even when high dc magnetic fields are applied to them. The main parameter describing the properties of such tapes is maximum critical current density ($J_c$), which a superconducting tape can hold at given temperature and the dependence of this critical current on dc magnetic field. Tapes have to maintain superconducting properties at very high field when used in superconducting magnets and/or electric motors. Conventional methods of characterizing superconducting properties of tapes is done after the fabrication process is finished. However, if a defect is detected after fabrication, it is no longer possible to change process parameters and correct it. The present process and apparatus provide real time feedback on the fabrication process, because the characterization is done in-situ at room temperature.

The present disclosure comprises a dielectric technique for measuring the complex impedance of HTS tapes. This dielectric resonator technique is a versatile and relatively inexpensive technique.

In one embodiment, dielectric resonators are used to perform in situ surface resistance testing of the fabricated tapes. The dielectric resonators are designed to operate either in microwave or mm wave range, depending on the material to be measured. The dielectric resonator techniques can be adapted for measurements at the elevated temperatures used during annealing as well as at room and lower temperatures.

In certain embodiments, the resonators are specialized for characterization of normal state HTS tapes and dielectric buffer layers. Hardware and software used in these techniques for NDE process and quality control are described.

In certain embodiments, one or more microwave resonators/sensors placed in the process/annealing chamber of an apparatus for producing HTS tapes allow for real time monitoring of surface resistance as the tapes are produced. Either rutile or sapphire discs can be used in a $TE_{01\delta}$ configuration for a several mm² area of the measured tapes, because the criteria for material to be used as dielectric disk includes relatively high dielectric constant and low loss tangent parameters. High dielectric constant allows for making such disk a small diameter disk, and low loss tangent allows for high sensitivity. In some cases single crystal material such as sapphire and rutile are used, in other cases a special low loss tangent ceramic is selected.

The present apparatus and method measure the surface resistance as a function of temperature ($R_s=R_s(T)$). In certain embodiments, this is accomplished by measuring at least two temperature points of $R_s(T)$ dependence. The temperature dependence of normal state resistivity correlates with the critical current density $J_c$ value. $J_c$ is related to dc magnetic field dependence. Moreover, there is strong correlation between superconducting parameters and the slope of $R_s$ vs. T in the normal state.

Correlations between $R_s$ vs. T plots and superconducting state parameters have been investigated (Muller 1987, Yoshihara 1995). In the present disclosure, the slopes of normal state microwave $R_s$ vs. T plots are correlated with superconducting state parameters such as critical temperature, critical temperature width, and residual surface resistance. It is also shown that the slope of an $R_s$ vs. T plot can be correlated with parameters describing dc (direct current) critical current $J_c$ capability of tapes. Dc parameters such as critical current $J_c$ and its dependence on magnetic field are usually used for evaluation of the quality of YBCO tapes for various applications. In general, it can be expected that the steeper slope, the better the superconducting film.

BRIEF DESCRIPTION OF DRAWINGS

The following drawings form part of the present specification and are included to further demonstrate certain aspects of the subject matter. The subject matter may be better understood by reference to one or more of these drawings in combination with the detailed description of specific embodiments presented herein.

DETAILED DESCRIPTION

Figure 1:
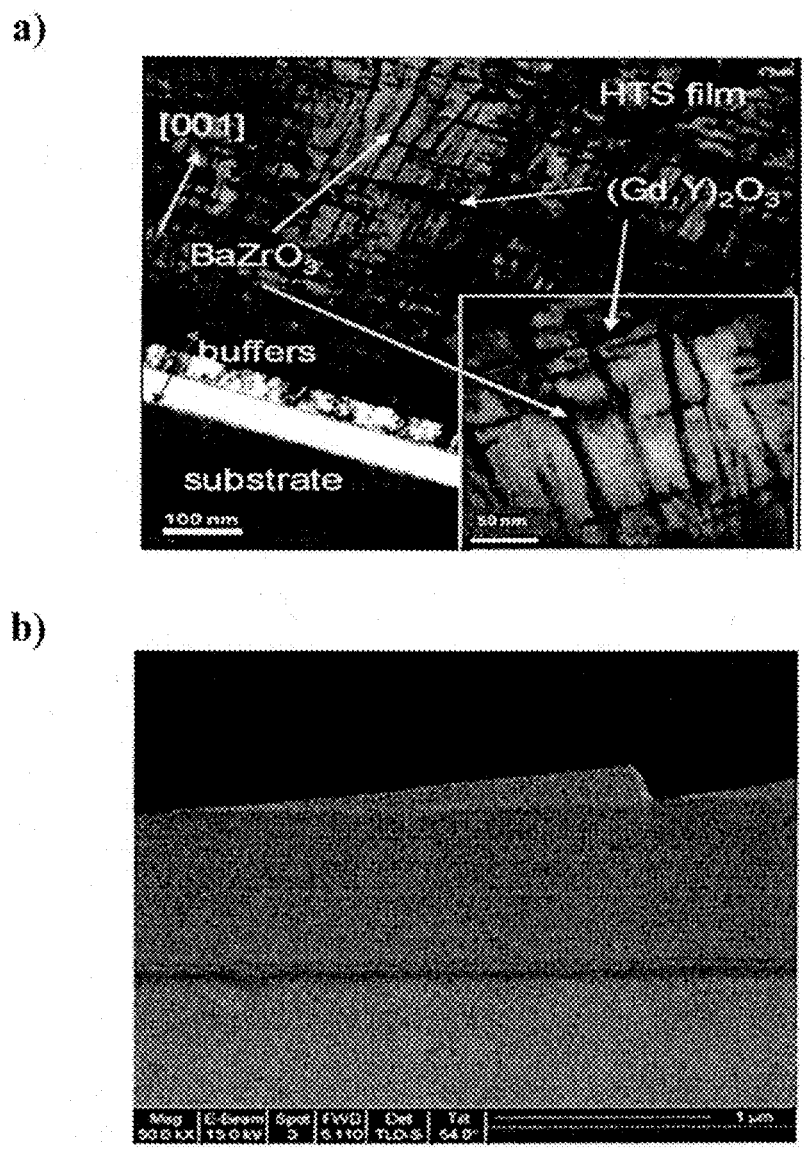
FIG. 1 shows: (a) a cross-section TEM of a Zr:YGdBCO film showing the BZO nanocolumns distributed in the film in addition to $(Gd,Y)_2O_3$ nanoprecipitates, and (b) an image obtained by FIB (Focus Ion Beam) of the same film.

It will be readily apparent to one skilled in the art that various substitutions and modifications may be made in the subject matter disclosed herein without departing from the scope and spirit of the invention.

The present disclosure provides real-time methods of monitoring the quality of HTS tapes during production, including the measurement of the complex impedance of HTS tapes using dielectric resonator techniques. These techniques can be non-destructive and non-contact, and are relatively inexpensive.

The present methods and apparatus can be used with any high critical temperature superconductor and any substrate. Examples of applicable superconductors include YBCO, thallium, and bismuth based superconductors. Examples of applicable substrates include Hastelloy, or any other substrate onto which superconducting film can be deposited such as silver, copper, similar to Hastelloy alloys, sapphire, zirconia, magnesium oxide, strontium titanate and other dielectrics.

In an embodiment, dielectric resonators are used to perform in situ surface resistance testing of a fabricated HTS tape. The dielectric resonators are designed to operate either in microwave or mm wave range, depending on the material to be measured. The dielectric resonator techniques can be adapted for measurements at the elevated temperatures used during annealing as well as at room and lower temperatures.

In certain embodiments, the resonators are specialized for characterization of normal state HTS tapes and dielectric buffer layers. Hardware and software used in these techniques for NDE process and quality control are provided.

The present disclosure provides methods and apparatus for monitoring quality control of differing compositions of superconducting tapes. In one embodiment, the substrate comprises dielectric material, which can be penetrated by electromagnetic waves. In another embodiment, the substrate comprises metallic material, for example the alloy Hastelloy, from which microwaves are reflected. Measurements using conventional methods are complicated by metallic substrates. The present method can be used for either type of tape.

In certain embodiments, one or more microwave resonators/sensors are placed in the process/annealing chamber of an apparatus for producing HTS tapes to allow for real time monitoring of surface resistance as the tapes are produced. Either rutile or sapphire discs are used in an electromagnetic mode (for example $TE_{01\delta}$) configuration. Such resonators/sensors analyze an area of the measured tapes from a few square mm to several centimeters.

In principle, a preferred dielectric resonator needs a low microwave loss dielectric disk. For a given frequency, the size of this disk will depend on the dielectric constant value. For example, a sapphire (epsilon ~10) disk resonating at 10 GHz is 9 mm in diameter and 5 mm in height. For the same frequency, a rutile disk will be much smaller (3 mm in diameter and 2 mm in height). BZT is ceramic, inexpensive and easy to make. It is not as good as sapphire, or rutile single crystals (in terms of microwave loss), but it is good enough for some applications. Rutile may be difficult to use, because its dielectric constant is very sensitive to temperature changes. In general a low microwave loss dielectric material with weak dependence on temperature in the range of temperature interest (above 100 K and to 450 K) should be used.

Figure 13:
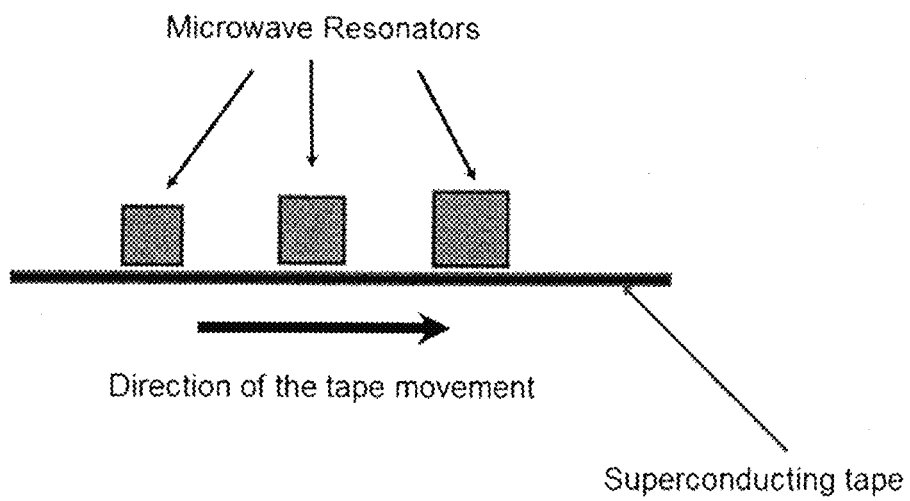
FIG. 13 shows (a) a side view and (b) a top view of a configuration in an exemplary embodiment for resonators for superconducting films on a metallic substrate using one or more dielectric resonators resonating at the same or different frequency.
Figure 13:
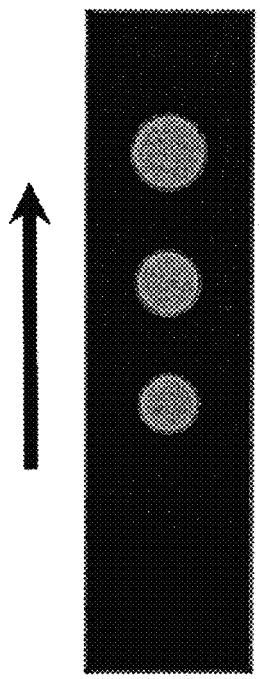

This disclosure refers to and describes single post dielectric resonators (SPDR) and rod dielectric resonators (RDR). These allow measurements having the disk at some distance from the tape (in the SPDR configuration), or the disk can touch the tape (in the RDR configuration). The RDR configuration is still a non-contact method, because no "contact" is deposited. For example, no gold or silver round contacts to which something can be soldered are deposited. Such touching does not do any damage to the tape. A dielectric resonator in general consists of a dielectric disk, a copper enclosure and a coupling structure, for example coaxial cables with a loop or dipole on the end or a microstip placed close to the disk. However, for dielectric disks having a large dielectric constant, an enclosure is not needed because microwave fields are confined in the disk because of this large dielectric constant. This allows for some flexibility. For example, FIG. 13 shows three disks without any enclosure, which represents a real case. What really counts in a dielectric resonator is the dielectric disk. Fields are excited in such a disk.

The present apparatus and method measure the surface resistance as a function of temperature ($R_s=R_s(T)$). In certain embodiments, this is accomplished by measuring at least two or three temperature points of $R_s(T)$ dependence. The temperature dependence of normal state resistivity correlates with the critical current density $J_c$ value. $J_c$ is related to dc magnetic field dependence. Moreover, there is strong correlation between superconducting parameters and the slope of $R_s$ vs. T in the normal state.

One embodiment provides a method of evaluating superconducting state parameters such as critical temperature, critical temperature width, and residual surface resistance, with the slopes of normal state microwave $R_s$ vs. T plots of a tape. It is also shown in the instant disclosure that the slope of an $R_s$ vs. T plot can be correlated with parameters describing dc capability of tapes. Dc parameters such as critical current density $J_c$ and its dependence on magnetic field are useful for evaluating the quality of YBCO tapes for various applications. In general, if the slope deviates from an ideal slope, the quality of the superconductor has changed. Moreover, it can be expected that the steeper the slope, the better the superconducting film. A "better" superconducting film may have, for example, a high density critical current and relatively small anisotropy when the critical current is measured versus magnetic field.

Figure 2:
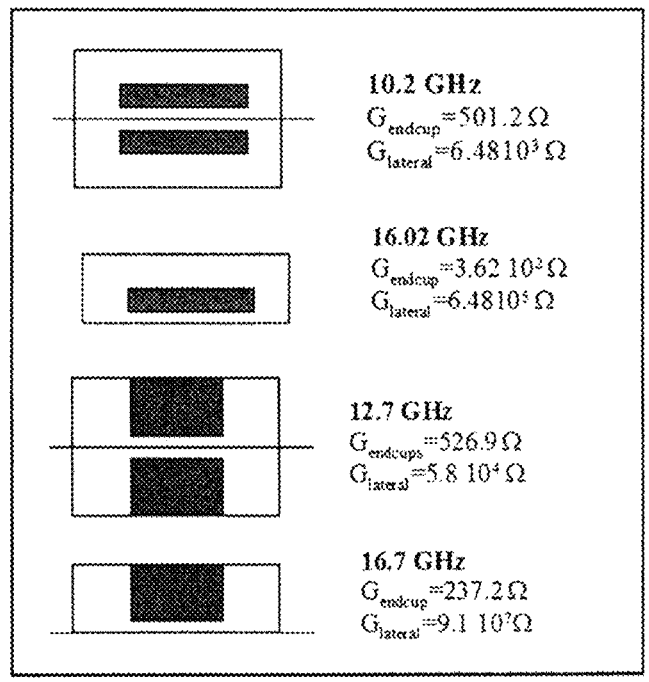
FIG. 2 shows (a) schematics of resonators which can be used to measure complex conductivity of flexible superconducting tapes in exemplary embodiments and (b) a schematic of an exemplary measurement apparatus.
Figure 2:
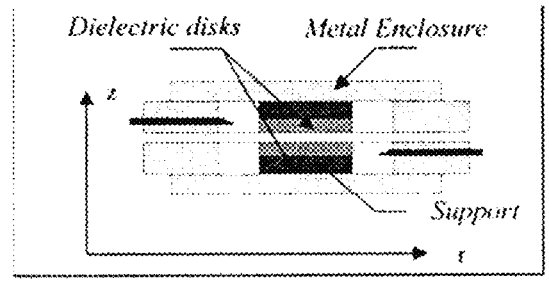

Examples of possible dielectric resonator configurations, which can be used to characterize HTS tapes, are shown in FIG. 2a. Configuration of the resonator will be selected and optimized for a specific superconducting tape. Such configuration selection will depend on the tape type, properties, and temperature range of characterization. Formulas describing the quality factor of dielectric resonators as a function of internal parameters are shown below:

$$\frac{1}{Q} = p_d \tan\delta + p_s \tan\delta + p_g \tan\delta + \frac{R_s^{enclosure}}{G_{enclosure}} + p_{sample}\tan\delta$$

$$\frac{1}{Q} = p_d \tan\delta + p_s \tan\delta_s + p_g \tan\delta_g + \frac{R_s^{enclosure}}{G_{enclosure}} + \frac{R_s^{sample}}{G_{sample}}$$

where:
$p_d$—electric field filling factor of the sapphire disc
$p_s$—electric field filling factor of the support
$p_g$—electric field filling factor of the glue
$G_{enclosure}$, $G_{sample}$ are geometrical factors of enclosure and sample An additional schematic of a measurement apparatus is provided in FIG. 2b.

Figure 14:
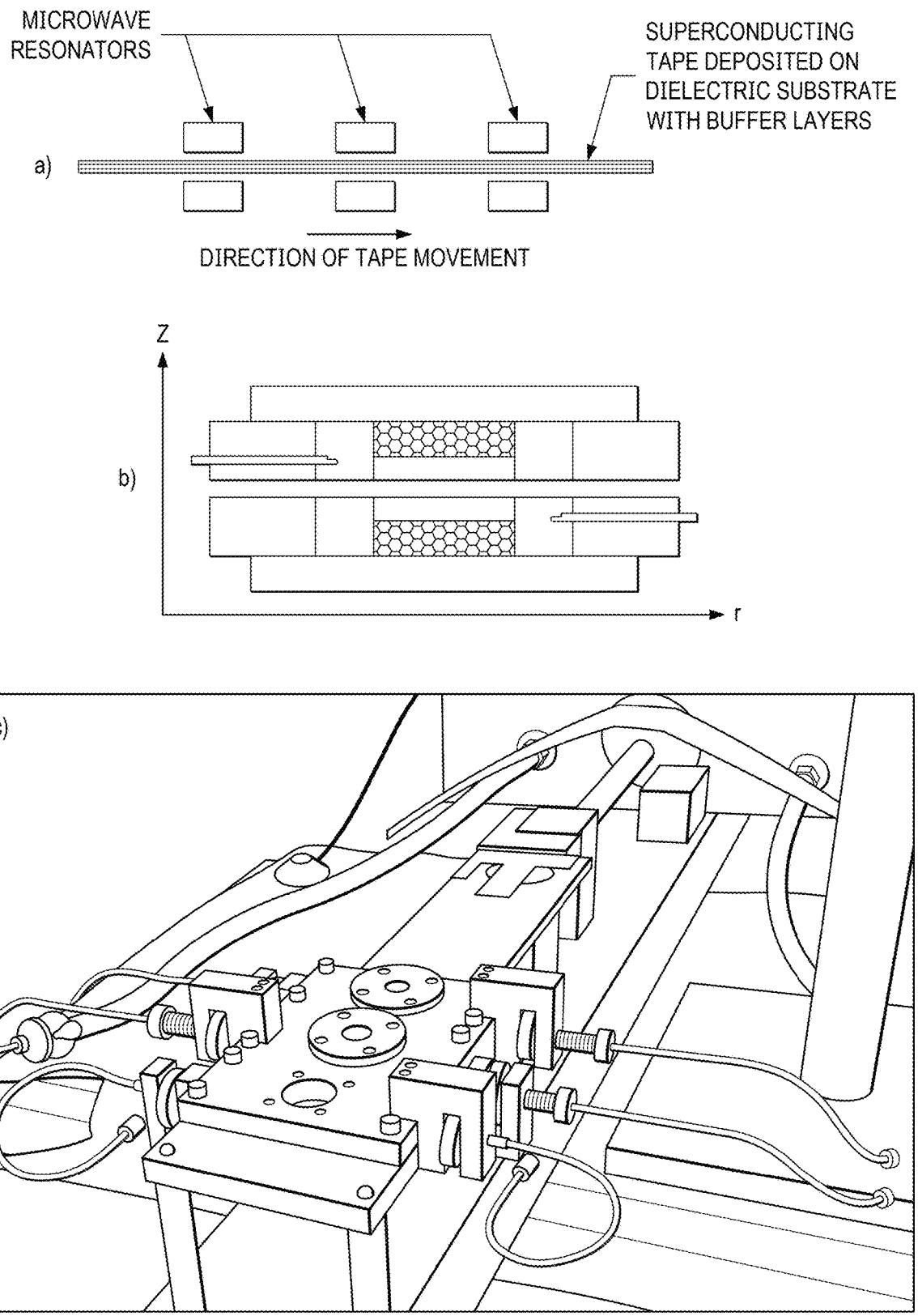
FIG. 14 shows (a) a side view, (b) a schematic, and (c) a photograph of a configuration for three resonators in a line in an exemplary embodiment for superconducting films on dielectric substrate, optionally using split resonators.

FIG. 13 shows (a) a side view and (b) a top view of a configuration in an exemplary embodiment of an apparatus for use in monitoring quality of superconducting films on a metallic substrate using one or more dielectric resonators resonating at the same or different frequency. FIG. 14 shows (a) a side view, (b) a schematic, and (c) a photograph of a configuration of an exemplary embodiment of an apparatus using three resonators in a line for monitoring quality of superconducting films on dielectric substrate, optionally using split resonators.

EXAMPLES

MOCVD Deposited YBCO Coated Conductor Tapes

YBCO tapes were deposited by metal organic chemical vapor deposition (MOCVD) on an IBAD-MgO template, which has a multilayer structure of $LaMnO_3$/homoepitaxial-MgO/IBAD MgO/$Y_2O_3$/$Al_2O_3$/hastelloy tape. The precursor solutions for Y, Ba and Cu were mixed together in an appropriate mole ratio and then delivered to a vaporizer by a liquid pump. The resulting precursor vapors were then mixed with oxygen and carried by argon gas to a showerhead using oxygen flow rates. This was followed by spraying of the mixture to produce about 0.9 µm thick YBCO tapes on a heated substrate.

Three tapes of Zr-added (GdY)BCO ($Zr_{0.06}Gd_{0.6}Y_{0.6}Ba_2Cu_3O_7$) were selected. $T_c$ was about 89.3 K for all three (GdY)BCO tapes and $I_c$ values in zero magnetic field were 165 A, 270 A and 339 A for tapes with thickness of 0.84 µm, 1.02 µm and 1.06 µm, respectively. The amount of Zr dopants ($BaZrO_3$) and abundant nanometer-sized precipitates of $RE_2O_3$ generate the density of defects to enhance the flux pinning in a strong magnetic field and self-field. In such a case, determination of the electrical parameters of superconductors is not as simple as it is for temperatures well below $T_c$. FIG. 1(a) shows a cross-section TEM and 1(b) shows an image obtained by FIB (Focus Ion Beam) of exemplary films.

Figure 3:
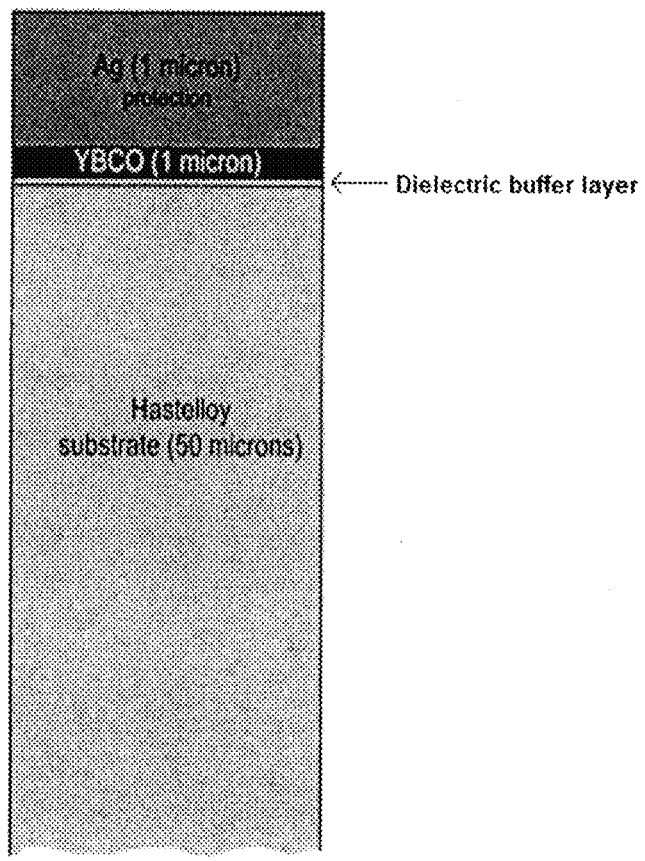
FIG. 3 shows (a) a multilayered structure making up an exemplary embodiment of a HTS tape and (b) a magnified view of the dielectric buffer layer of the multilayered structure.
Figure 3:
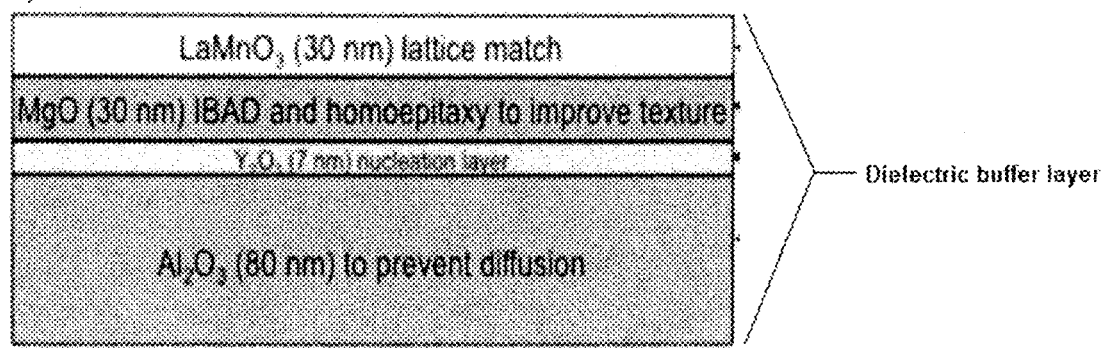

The deposition process is completed when 1 mm thick protective silver layer is deposited on top of YBCO film. In modeling of such structure, multilayered configuration is assumed, as depicted in FIG. 3. It consists of 1 mm thick protective layer of silver, 0.5 mm YBCO film, dielectric buffer layer and 50 mm thick Hastelloy substrate. Overall thickness of the buffer layer is around 160 nm taking into account $Al_2O_3$ 80 nm thick layer for diffusion prevention, 10 nm $Y_2O_3$ layer for nucleation, 30 nm MgO layer made by IBAD technique for homoepitaxy and of the buffer texture improvement and $LaMnO_3$ layer, 30 nm for lattice matching purposes. For all measurements carried out, the protective silver layer was removed, because skin depth of silver is below 1 mm at microwave frequencies and as a result electromagnetic waves will be not able to penetrate silver and to reach the to-be-characterized YBCO layer.

Dielectric Resonator Technique

Two different configurations of dielectric resonators designed to accommodate 12 mm wide YBCO/Hastelloy tapes were used. The first configuration, a single post dielectric resonator (SPDR) operating at 13 GHz in $TE_{01\delta}$ mode was designed for maximum measurement sensitivity of lossy and/or thin materials. The construction of the SPDR was similar to the resonator used for measurements of the sheet resistance of graphene. The SPDR with a low loss, high-permittivity barium zirconium titanate (BZT) ceramic ($\varepsilon_r=27.93$ at 300 K) disk is to measure the conductivity of very thin semi-transparent or/and lossy tapes in the normal state i.e. $T>T_c$. The BZT dielectric of radius 2.5 mm and height 2 mm is placed inside the copper cavity of radius 9 mm at a height of 3 mm. The sample is placed at a distance of 2.5 mm from the BZT dielectric. The second configuration consists of a rod dielectric resonator (RDR) operating at 9 GHz in $TE_{011}$ mode with ($TiO_2$) dielectric disk ($\varepsilon_r=86$ at 300K; 108 at 77K), which was used for measurements of the complex conductivities $\sigma_1$ and $\sigma_2$ of the YBCO/Hastelloy tapes in the superconducting state. The samples are placed on either side of the rutile dielectric disk of radius equal to 2.35 mm and height 2.5 mm, and placed in a copper enclosure of radius 7 mm. There is no air gap between rutile disk and YBCO films.

Figure 4:
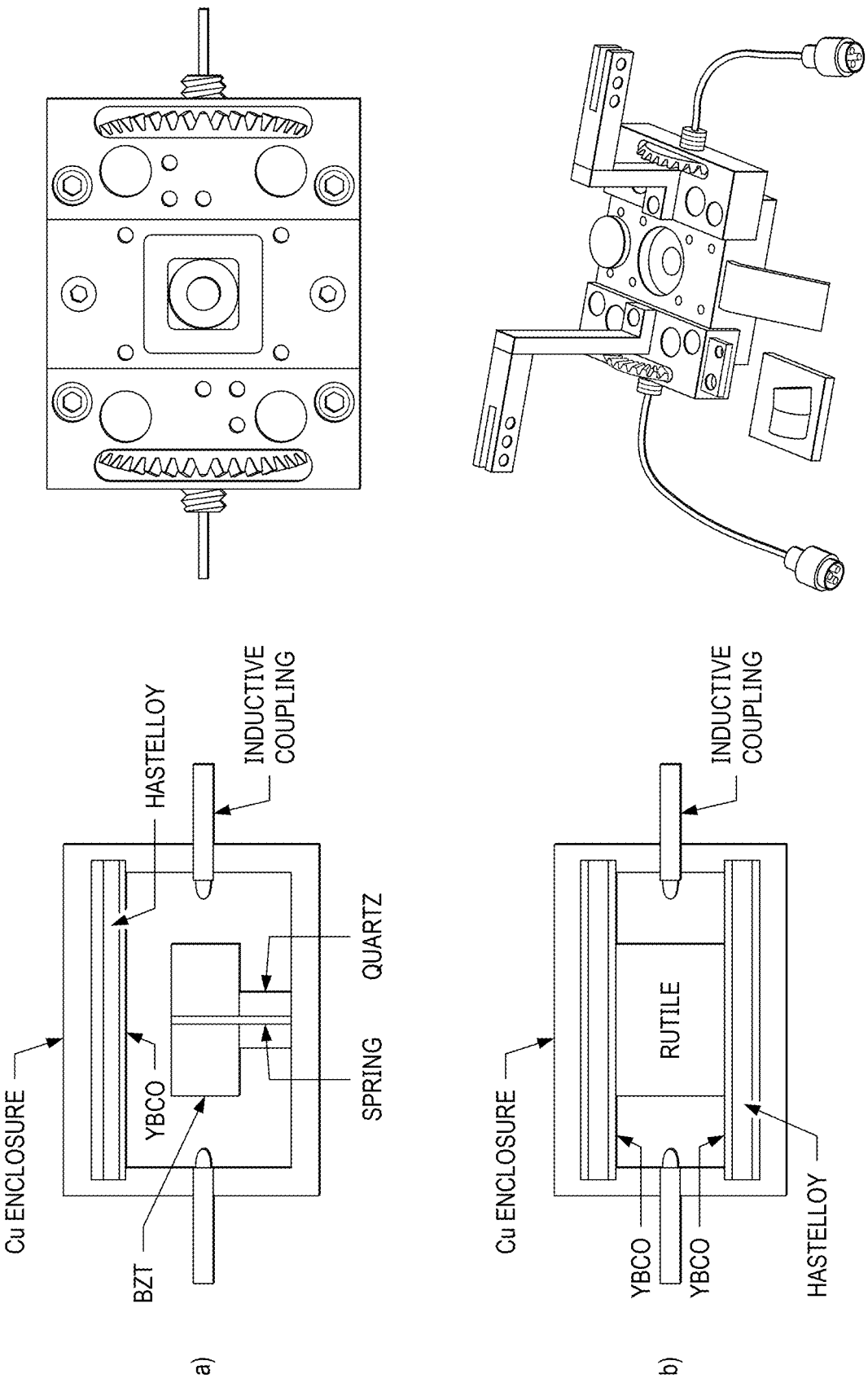
FIG. 4 shows schematic representations and pictures of exemplary embodiments of measurement apparatus: (a) a $TE_{01\delta}$ mode 13 GHz BZT single post dielectric resonator (SPDR), with $\varepsilon_r$ of 27.93 at 300 K and (b) a $TE_{011}$ mode 9 GHz rutile rod resonator (RDR), with $\varepsilon_r$ of 108 at 77 K and 78 at 300 K.

The SPDR and RDR configurations are presented in FIG. 4a and FIG. 4b respectively. The resonant structure allows for the confinement of EM energy in the high permittivity medium. The design of the rutile-DDR is such that the strong magnetic field at the center of the rutile disk characteristic of the $TE_{011}$ mode is disturbed by the loss in the test sample. The resonator has a high Q-factor and hence enough sensitivity to measure very low loss samples such as YBCO in the superconducting state. The technique ideally employs two identical YBCO/Hastelloy tapes mounted for an accurate measurement. For measurements with the rutile resonator, Q-factors depend mainly on the losses in the sample, because parasitic losses are negligible for a well-designed resonator with sufficiently large diameter of the enclosure. Such design, however, leads to a rapid degradation of Q-factor as the losses in the sample increase making almost impossible to measure accurately the YBCO sample at mixed and normal state, i.e. for temperature range close and above $T_c$. The SPDR used in this work operated at 9 GHz in the $TE_{01\delta}$ mode, where $\delta$ denotes the leakage of EM field at the dielectric/air interface. Due to the sample placement (in this case, distance from DR is 2.5 mm) and the quartz support, the SPDR structure has more complicated sources of parasitic losses than the rutile-DRR thus require in order to accurately calculate. However, this also lowers the rapid degradation of Q-factor which enable the SPDR to be used efficiently in measuring the YBCO/Hastelloy in the normal state i.e. $T > T_c$.

The measurements of Q-factor and frequency as a function of temperature were performed with the resonators mounted in a closed cycle liquid nitrogen cryostat. One-port Kajfez method of Q-factor measurements, which included calibration of the network analyzer and cryostat cables losses, was used to measure and calculate the Q-factor. The coupling loop, which inductively excites the appropriate mode in the DR was connected to the HP86390 network analyzer. The GaAs temperature diode, thermally connected to the resonator via indium layer, used a Lake Shore temperature controller to control and measure temperature of YBCO tapes. The measurement data of Q-factor, frequency and temperature were collected at a user-defined time interval, which in the present case was every 10 seconds through a GPIB interfaced computer program.

Numerical Simulations

Extraction of complex conductivity from measured Q-factor and frequency shift with temperature dependencies requires calculations of the electromagnetic fields in the resonant structure. Numerical simulation of the field calculations were performed using high frequency structural simulator (HFSS), a finite element method (FEM) based tool considering the same dimensions of the DR as in the experimental setup. The material parameters of copper cavity, dielectric and air cavity were defined by their respective permittivity, conductivity and loss tangent. Material properties of Hastelloy along with an impedance boundary condition defining the sheet resistance of the superconducting tape were used to describe the sample under simulation. To ensure the accuracy of the simulation solution, the structure was finely meshed along the dielectric disk and sample regions. Two different analysis methods, driven and eigen modes, were used to calculate numerically the dependence of frequency and Q-factor, respectively, on sheet resistance $\sigma_1 h$ (S/m). The eigen mode analysis which is a mode matching technique was used to determine the natural modes of the resonator and the Q-factor at each of the calculated resonant frequencies. Using the DR's experimentally measured resonant frequency as the starting point, the minimum frequency for the eigen mode analysis was determined. The appropriate Q-factor was determined by observing the electric and magnetic field distribution for each resonant mode to identify the $TE_{01n}$ mode.

Figure 5:
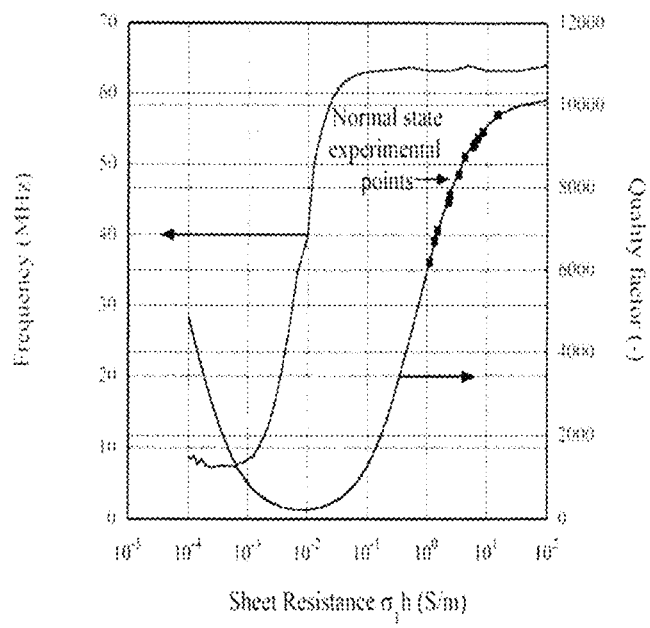
FIG. 5 shows correlated experimental data with eigen mode analysis of Q-factor and driven mode analysis of frequency as a function of sheet resistance for: (a) BZT ceramic SPDR apparatus, (b) and RDR apparatus, in exemplary embodiments.
Figure 5:
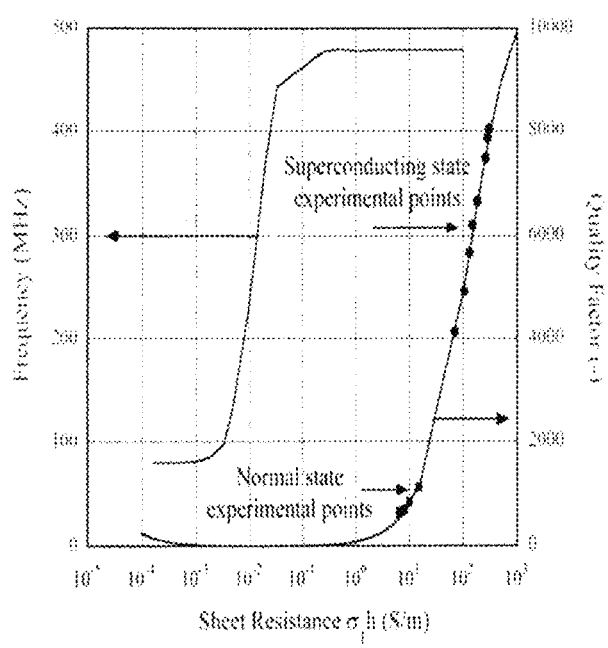

Parametric analysis over a wide range of sheet resistance values was performed to obtain Q-factor as a function of sheet resistance as shown in FIG. 5. For a more precise determination of the resonant frequency of the $TE_{01n}$ mode for varying sheet resistance values, the driven mode analysis in HFSS is utilized to simulate over a frequency range centered on the resonant frequency determined by eigen mode analysis. Further, the driven mode analysis was used to compute the nodal S-parameters which in HFSS is described in terms of the incident/reflected power of the dominant mode. In this method, similar to the experimental set-up a magnetic field coupling loop is used to inductively excite desired mode in the resonators.

The coupling loop in the driven mode analysis was drawn to mimic a coaxial cable loop made to excite the $TE_{01n}$ mode. A waveport was used to simulate an external wave of power 1 W of magnitude incident on the outer end of the coupling loop. In the driven mode analysis, the interpolating sweep where the solution is interpolated based on the number of frequency points solved was used to determine the one-port S-parameters. The fast sweep utilizing an adaptive Lanczos-Pade sweep (ALPS) algorithm extrapolating the center frequency solution was used to obtain the fields distribution and to check the accuracy of the determined resonant frequency.

Calculation of Complex Conductivity

Figure 6:
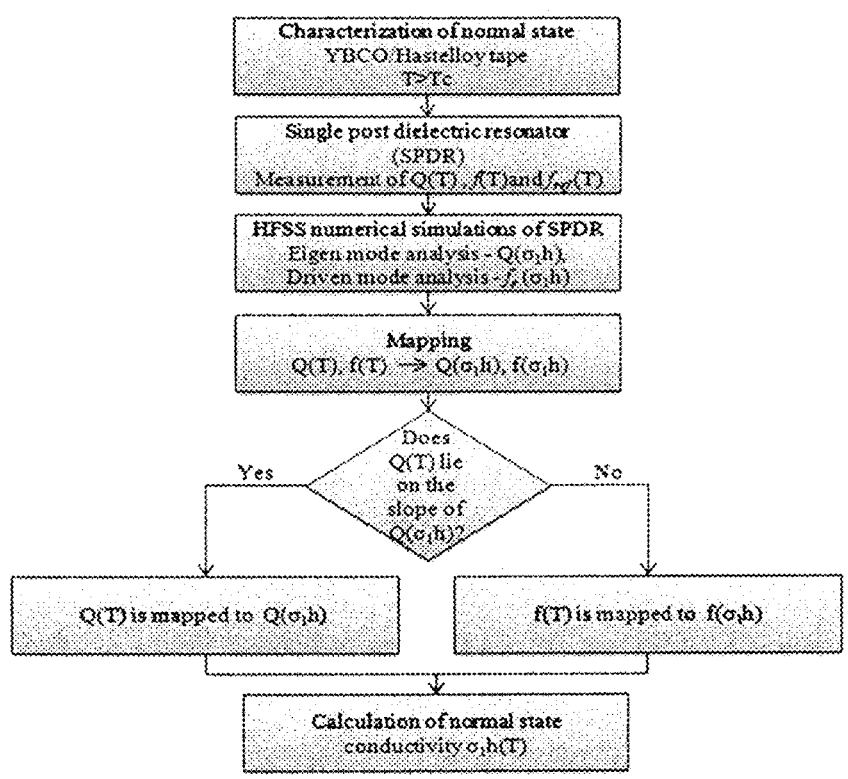
FIG. 6 shows a flow chart depiction of the calculations of complex conductivity for normal state, in exemplary embodiments.

For the calculation of the conductivity of YBCO/Hastelloy tape in normal state, the experimental data points of Q-factor i.e. Q(T) is mapped to the HFSS simulated Q-factor as a function of $\sigma h$. The mapping process is described in the flow chart shown in FIG. 6. As observed from FIG. 5b, using only the conventional rutile RDR to calculate both the normal and superconducting state conductivity fails since the mapped normal state experimental points are not discernible to calculate $\sigma_1 h(T)$.

Experimental Results

Using the two different resonator configurations (i.e. SPDR and rutile rod resonator) the conductivity, later converted into surface resistance $R_s$, of Hastelloy and Hastelloy/buffer/YBCO were measured at normal and superconducting states.

Figure 7:
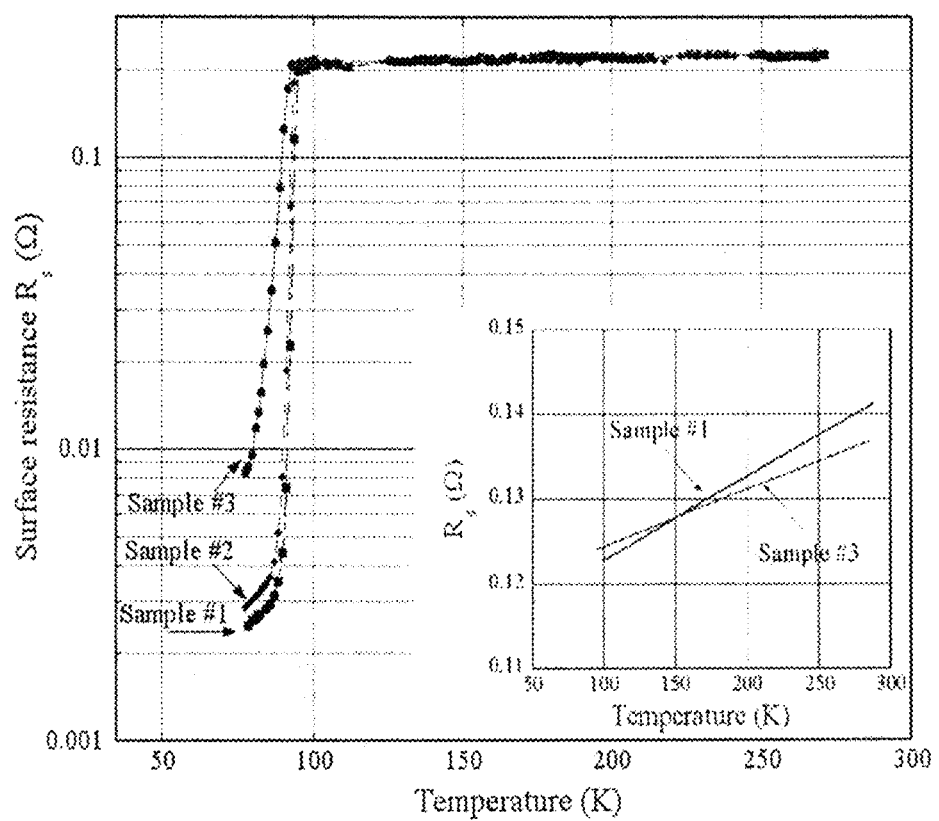
FIG. 7 shows surface resistance vs. temperature measured for three $Zr_{0.06}Gd_{0.6}Y_{0.6}Ba_2Cu_3O_7$ samples with thicknesses of 0.84 μm, 1.02 μm, and 1.06 μm, the $I_c$ values (at zero magnetic field) of 165 A, 270 A and 339 A, respectively, in exemplary embodiments.
Figure 8:
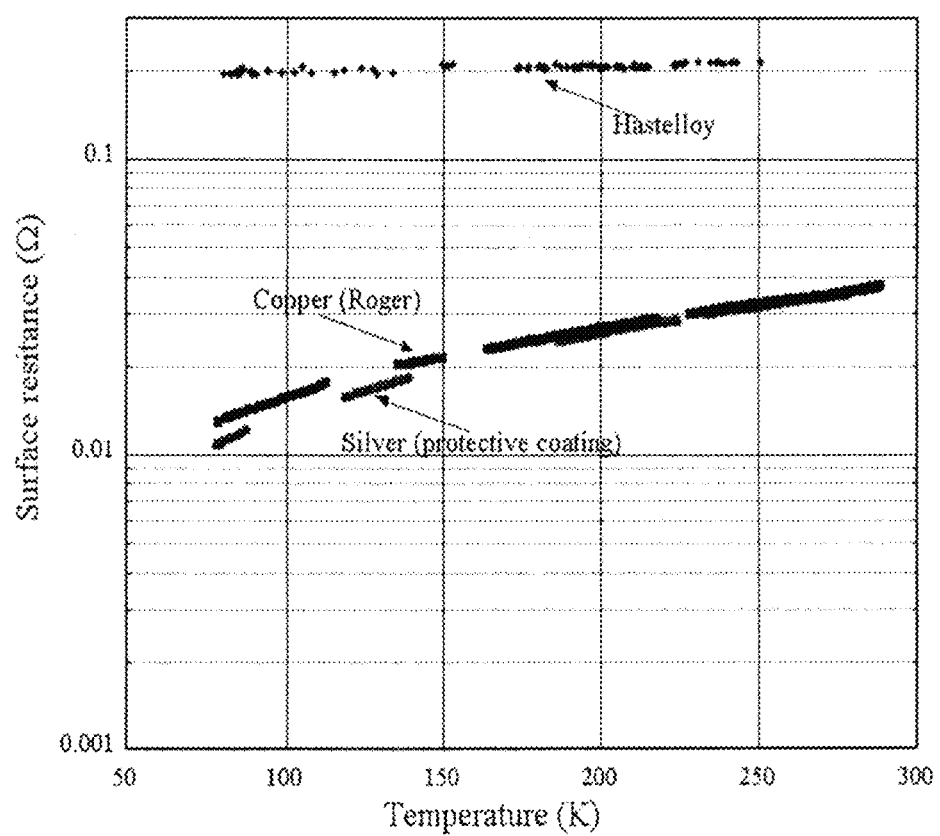
FIG. 8 shows surface resistance vs. temperature measured for Hastelloy silver and copper, for comparison, in exemplary embodiments.

FIG. 7 shows surface resistance vs. temperature measured for three $Zr_{0.06}Gd_{0.6}Y_{0.6}Ba_2Cu_3O_7$ samples with thickness of 0.84 μm, 1.02 μm and 1.06 μm and the $I_c$ values (at zero magnetic field) of 165 A, 270 A and 339 A, respectively; $R_s$ vs. temperature for Hastelloy substrate. Temperature ranges from either 77 K or 10 K to 300 K were used in the measurements of the Q-factor and frequency shift when YBCO/Hastelloy samples (12 mm×12 mm substrates) were incorporated into the resonators structure. FIG. 8 shows surface resistance vs. temperature measured for Hastelloy silver and copper, measured for comparison.

A YBCO of a few hundred nanometers' thick and deposited on Hastelloy tape is semitransparent to microwaves at X-band frequency in the normal state. Both materials Hastelloy and YBCO have very similar skin depth in this range of temperature. In such a case effective surface resistance $R_s$ is approximately equal to $1/\sigma^* h$, where h is the YBCO film thickness and $\sigma^*$ is the effective conductivity. As a result the measured resistance is of an order of Ω not mΩ. The resonator "sees" the difference between Hastelloy and YBCO/Hastelloy $R_s$. This means that semi-transparent 1 μm thick normal state YBCO layer introduces an additional loss sufficiently large to be sensed by the resonator. Because there is almost no temperature dependence of $R_s$ of Hastelloy and a much stronger temperature dependence for YBCO, this helps to extract $R_s$ of YBCO from the measured YBCO/Hastelloy response. It can be seen that YBCO in normal state, dielectric buffer layers do not change significantly the effective surface resistance of investigated multilayer.

Figure 9:
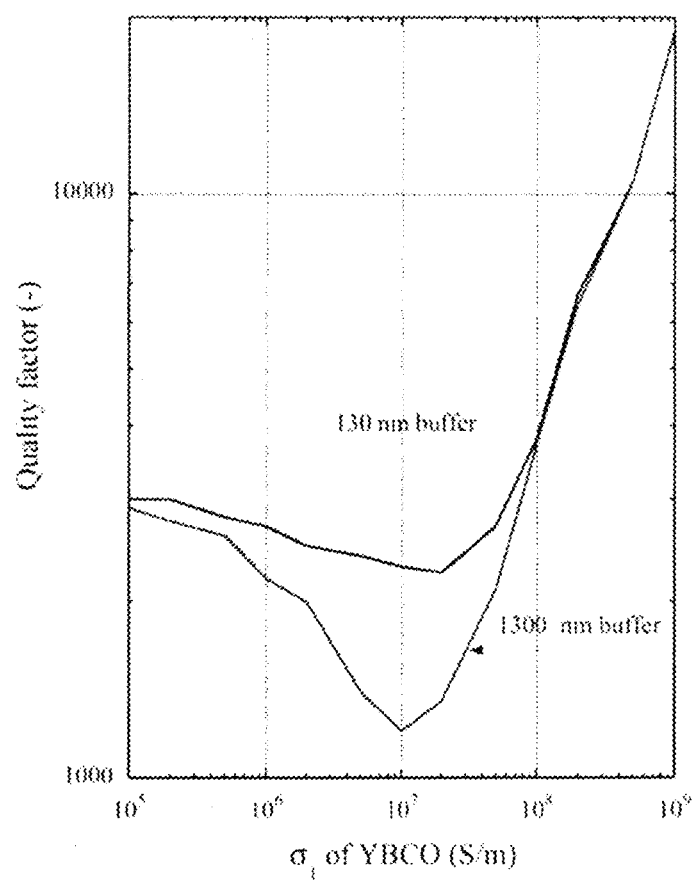
FIG. 9 shows a simulated Q-factor of the resonator for Cu/oxides/YBCO multilayers in an exemplary embodiment, with two different thickness values of buffers presented and the thickness of YBCO film assumed to be equal to 1 mm.

FIG. 9 shows simulated Q-factor of the resonator for Cu/oxides/YBCO multilayers. Two different thickness values of buffers are presented and the thickness of YBCO film was assumed to be equal to 1 μm. In these calculations, different thickness of the tapes was assumed. The upper tape had a thickness of 1 μm and the bottom tape had a thickness of 0.8 µm. Hastelloy parameters are taken as in FIG. 5. Buffer (oxides) thickness was assumed to be equal to 150 nm. Above 80 K measurements were not accurate due to resonance curve deviation from Lorentz shape.

Figure 10:
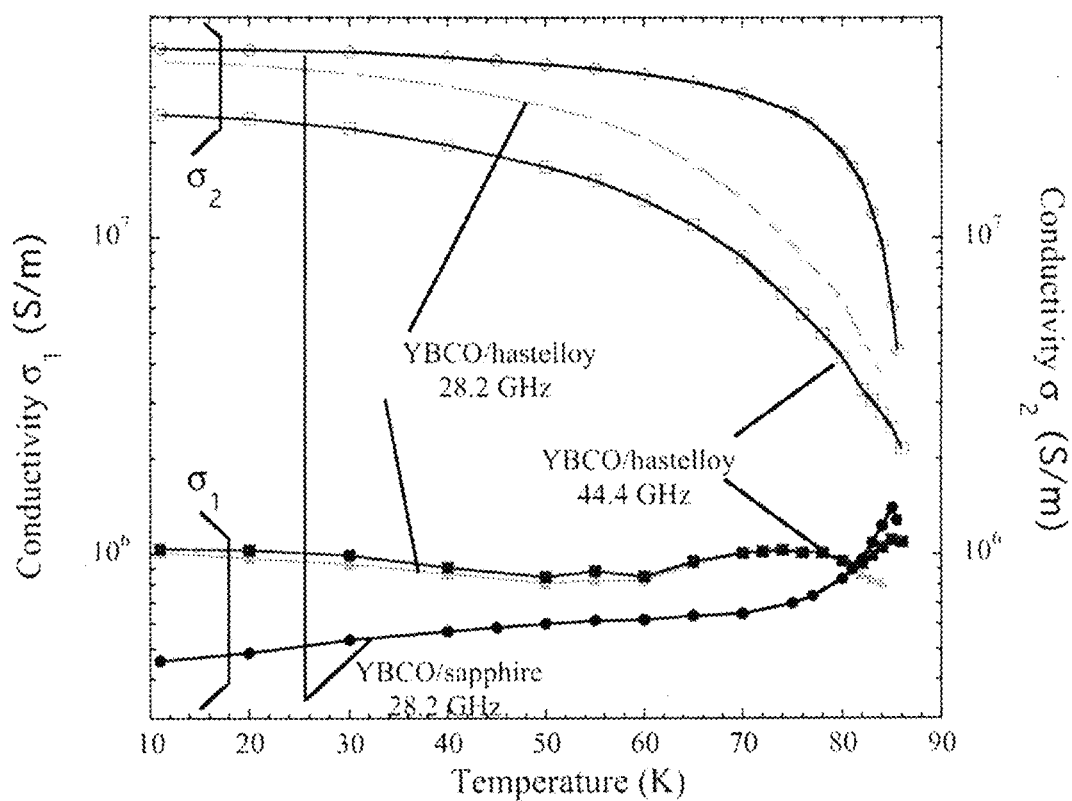
FIG. 10 shows complex conductivity of YBCO/Hastelloy tape (#1) extracted from Q=Q(T) and f=f(T) data, in an exemplary embodiment, using sapphire rod resonators at 28.2 GHz and 44.4 GHz and including a comparison between complexes for YBCO deposited on Hastelloy and sapphire substrates.
Figure 11:
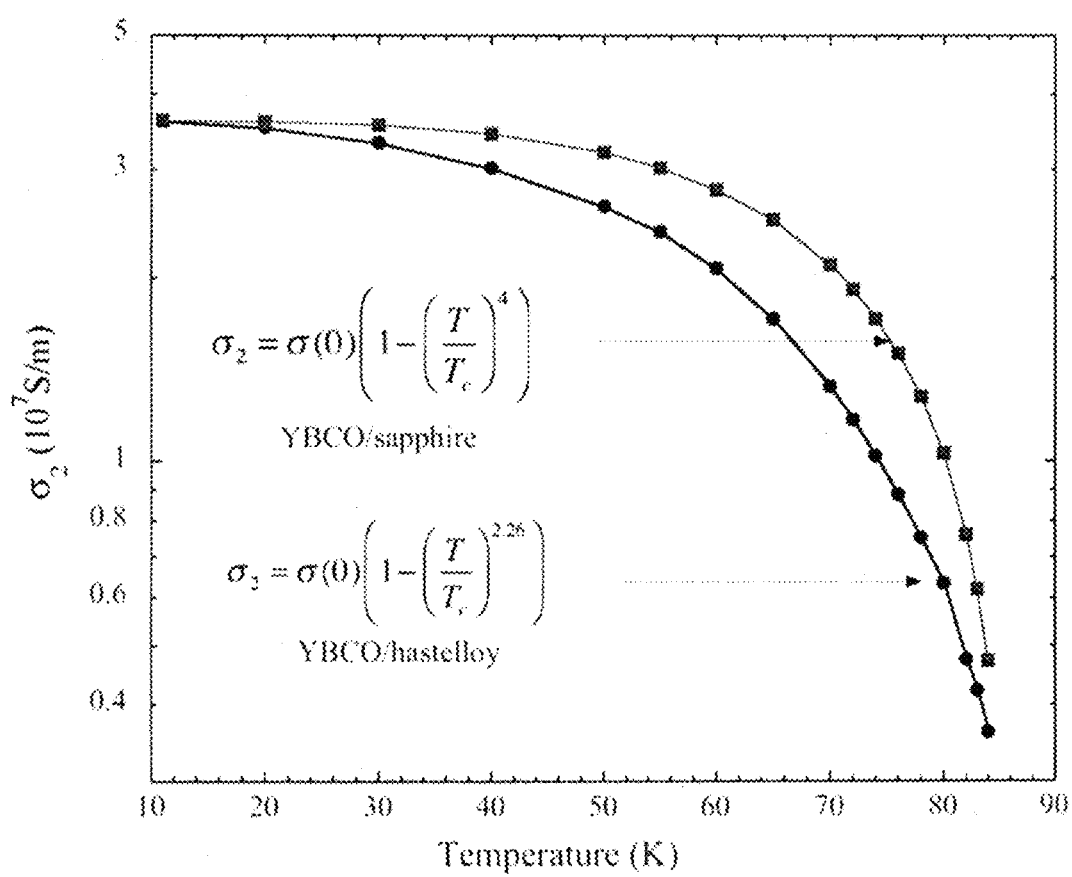
FIG. 11 shows a calculation of the imaginary part of permittivity, obtained from frequency shift measurements, for YBCO/Hastelloy sample #1 in an exemplary embodiment, compared to the same dependence for YBCO/sapphire, with solid lines representing fitting to two-fluid model described dependence.

FIG. 10 shows complex conductivity of YBCO/Hastelloy tape (#1) extracted from Q=Q(T) and f=f(T) data. Sapphire rod resonators 28.2 GHz and 44.4 GHz were used. Comparison between complex σ for YBCO deposited on Hastelloy and sapphire substrates is included. FIG. 11 shows $\sigma_2$ calculated from imaginary part of permittivity, obtained from frequency shift measurements, for YBCO/Hastelloy sample #1. For comparison purposes the same dependence was calculated for YBCO/sapphire. Solid lines represent fitting to two-fluid model described dependence. Different power coefficients are shown for both cases (2.26 and 4).

Discussion and Summary

The present disclosure provides a dielectric resonator technique and apparatus for measuring the conductivity of a Hastelloy tape, Hastelloy/buffer/YBCO with and without Ag over-layer over wide enough temperature range to cover both superconducting and normal metal properties of YBCO.

Microwave techniques take advantage of the fact that in contrary to dc currents, rf currents cannot meander, thus the electromagnetic response is integrated over the whole volume where rf currents are induced in the metal/superconductor.

Figure 12:
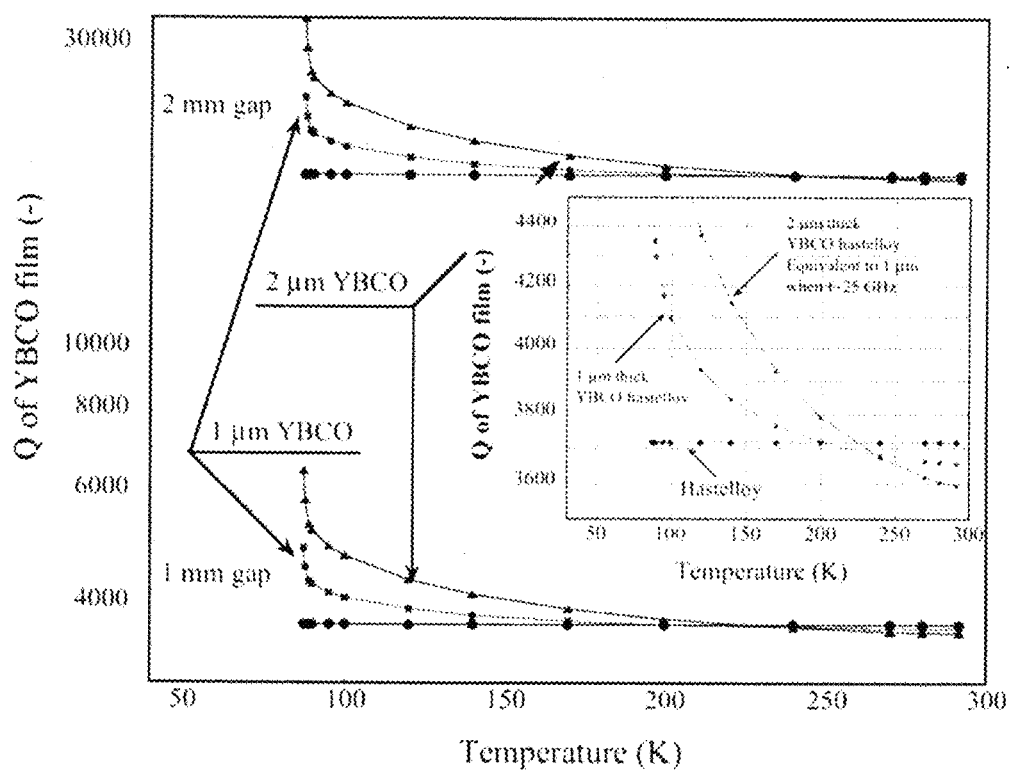
FIG. 12 shows the Q-factor due to YBCO/Hastelloy losses versus temperature in an exemplary embodiment, with temperature variations of YBCO tape Q assumed as measured, only tape losses presented, and both copper influence and parasitic effects removed.

FIG. 12 shows Q-factor due to YBCO/Hastelloy losses versus temperature. Temperature variations of YBCO tape Q assumed as measured previously. Only tape losses are presented. Both copper influence and parasitic effects are removed.

Calculations were performed for YBCO tape thickness of 1 µm and conductivity of the Hastelloy tape was assumed to be equal to 1 µm, conductivity s of Hastelloy was assumed to be equal to $6 \times 10^5$ S/m. Also no temperature dependence was assumed based on measurements.

The possibility of normal state $R_s$ measurements of superconductors was analyzed. Also the possibility of characterization of dielectric buffer layers (deposited directly on Hastelloy substrate below YBCO film) was analyzed. With YBCO tapes deposition on higher conductivity substrate such as copper substrates instead of Hastelloy, it would be possible to characterize the normal state $R_s$.

What is claimed is:

1. A method for monitoring quality control superconducting parameters of a superconductor tape, comprising the steps of:
   a) bringing at least one measurement apparatus into communication with the superconducting tape, to produce at least one dielectric resonator;
   b) obtaining experimental measurements of Q-factor, Frequency, and resonant frequency of the dielectric resonator as a function of temperature at selected time intervals, wherein the temperature is maintained within a temperature range above a critical temperature of the superconductor tape;
   c) performing numerical simulations and parametric analysis to calculate models of Q-factor and resonant frequency as a function of sheet resistance or conductivity of the superconductor tape;
   d) mapping the experimental measurements of Q-factor or resonant frequency of the superconductor tape to the models of Q-factor or resonant frequency as a function of sheet resistance or conductivity
   e) determining a complex conductivity of the superconductor tape; and
   f) correlating the complex conductivity of the superconductor tape with quality control superconducting parameters of the superconductor tape.

2. The method of claim 1, wherein the dielectric resonator is a single post dielectric resonator (SPDR).

3. The method of claim 2, wherein the single post dielectric resonator (SPDR) has a barium zirconium titanate (BZT) ceramic disk.

4. The method of claim 1, wherein the dielectric resonator is a rod dielectric resonator (RDR).

5. The method of claim 4, wherein the rod dielectric resonator (RDR) has a $TiO_2$ dielectric disk.

6. The method of claim 1, wherein the superconductor tape is in a normal state.

7. The method of claim 1, wherein the time interval is every 10 seconds.

8. The method of claim 1, wherein the steps are performed in real time during manufacture of the HTS tape.

9. The method of claim 1, wherein the quality control superconducting parameters are critical temperature, critical temperature width, residual surface resistance, or combinations thereof.

10. The method of claim 1, wherein the step of performing numerical simulations and parametric analysis includes performing high frequency structural simulator (HFSS) numerical simulations using material parameters of the measurement apparatus.

* * * * *